United States Patent [19]
Toyoda

[11] Patent Number: 5,828,108
[45] Date of Patent: Oct. 27, 1998

[54] SEMICONDUCTOR INTEGRATED CIRCUIT SUPPRESSING NOISES DUE TO SHORT-CIRCUIT/SUBSTRATE CURRENTS

[75] Inventor: Kenji Toyoda, Kanagawaken, Japan

[73] Assignee: Kabushiki Kaisha Toshiba, Kawasaki, Japan

[21] Appl. No.: 728,501

[22] Filed: Oct. 9, 1996

[30] Foreign Application Priority Data

Oct. 11, 1995 [JP] Japan ................................. 7-262634

[51] Int. Cl.⁶ .......................... H01L 29/76; H01L 29/94; H01L 31/062; H01L 31/113
[52] U.S. Cl. ........................ 257/372; 257/203; 257/204; 257/207; 257/208; 257/210; 257/373; 257/400; 257/503; 257/504; 257/547
[58] Field of Search .................... 257/203, 204, 257/207, 208, 210, 372, 373, 400, 409, 503, 504, 547

[56] References Cited

U.S. PATENT DOCUMENTS

| | | |
|---|---|---|
| 3,868,721 | 2/1975 | Davidsohn . |
| 4,027,325 | 5/1977 | Genesi . |
| 4,117,507 | 9/1978 | Pacor . |
| 4,240,093 | 12/1980 | Dingwall . |
| 4,246,594 | 1/1981 | Mori . |
| 4,757,363 | 7/1988 | Bohm et al. . |
| 4,924,111 | 5/1990 | Anderson et al. ...................... 307/270 |
| 5,324,978 | 6/1994 | Ludikhuize et al. ..................... 257/494 |
| 5,519,243 | 5/1996 | Kikuda et al. ........................... 257/371 |

*Primary Examiner*—Ngân V. Ngô
*Attorney, Agent, or Firm*—Oblon, Spivak, McClelland, Maier & Neustadt, P.C.

[57] ABSTRACT

A semiconductor integrated circuit has a semiconductor substrate on which macrocells are formed. At least one of the macrocells is surrounded by a first diffused region, which may be surrounded by a second diffused region. The first and second diffused regions are connected to power source terminals, respectively. Semiconductor elements included in each macrocell are connected to power source terminals that are independent of the terminals connected to the diffused regions. Alternatively, a voltage is supplied to the diffused regions through power lines that are different from power lines for the semiconductor elements. This arrangement absorbs short-circuit current in CMOS circuitry and/or substrate current produced by the semiconductor elements.

22 Claims, 7 Drawing Sheets

SEMICONDUCTOR INTEGRATED CIRCUIT SUPPRESSING NOISES DUE TO SHORT-CIRCUIT/SUBSTRATE CURRENTS

BACKGROUND OF THE INVENTION

1. Field of the Invention

The present invention relates to a semiconductor integrated circuit, and particularly, to a semiconductor integrated circuit capable of preventing the generation of noise at I/O terminals for cells in the integrated circuit.

2. Description of the Prior Art

A semiconductor integrated circuit such as ULSI, VLSI consists of a plurality of cells (or blocks) formed on a semiconductor chip. Each cell has elements such as transistors, diodes, resistors, and capacitors. Combinations of these elements realize required functions so that the integrated circuit may serve as a memory or an arithmetic element. The cells are called megacells or macrocells. In the following explanation, they are called "macrocells".

Figure 1A:
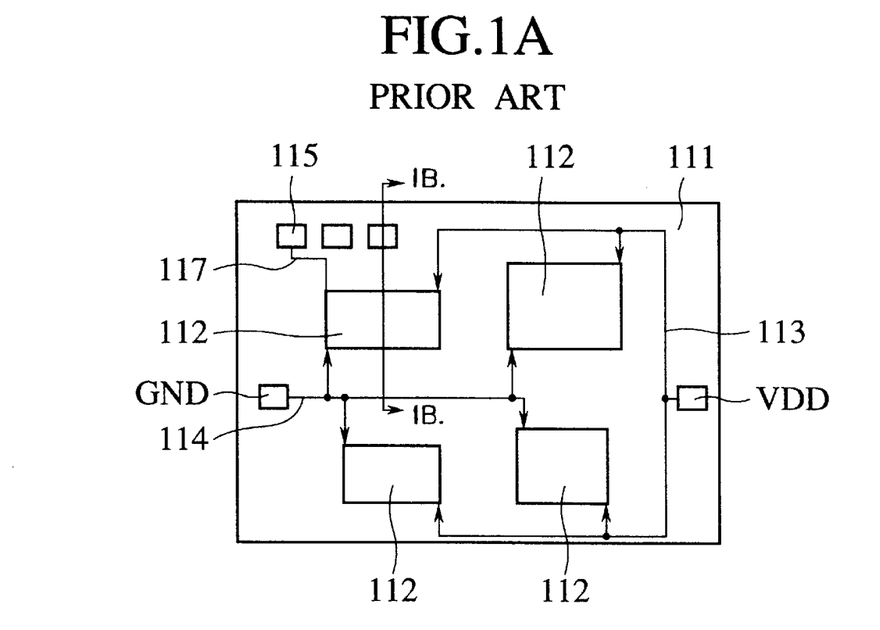
FIG. 1A is a top view showing a semiconductor integrated circuit according to a prior art.
Figure 1B:
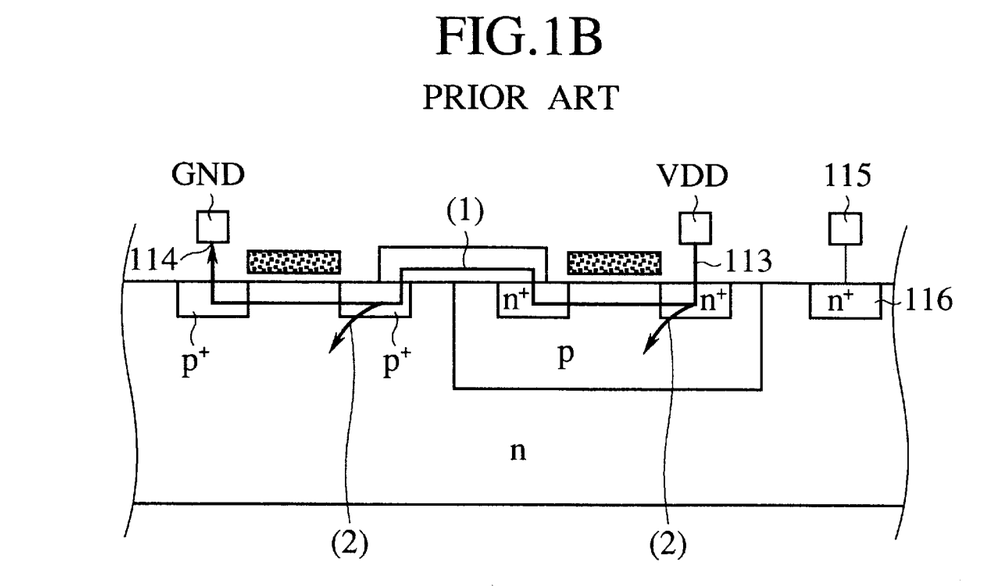
FIG. 1B is a cross-sectional view taken along a line A—A of FIG. 1A.

FIG. 1A is a top view showing a semiconductor chip 111 according to the prior art, and FIG. 1B is a cross-sectional view taken along line A—A of FIG. 1A. The chip 111 has macrocells 112 that are separated from one another. For the sake of simplicity of explanation, elements such as transistors formed in each macrocell are omitted from the figures, and only essential wiring is shown in the figures.

The elements of each macrocell 112 are connected, through a power line 113, to a terminal VDD for supplying an operating voltage and to a grounding terminal GND through a power line 114. The power lines 113 and 114 are made of a conductive film such as aluminum (Al), Al-silicon (Si), Al—Si-copper (Cu) films formed on the surface of the chip 111 or a diffused or buried region of conductive impurities formed in a semiconductor substrate of the chip 111.

The chip 111 has an input/output (I/O) terminal 115 for data and clock signals. The I/O terminal 115 is connected to a diffused region 116, or a heavily doped region of conductive impurities such as Boron (B), Phosphorus (P), Arsenic (As) formed under the I/O terminal and in the Si substrate. The diffused region 116 is connected to a signal line 117, which is a surface interconnection of conductive film or an impurity diffused region formed on or in the substrate.

In this way, the chip 111 has the macrocells 112 that are properly spaced apart from one another. The macrocells 112 are connected to the terminals VDD and GND through the power lines 113 and 114. The macrocells 112 are also connected to the I/O terminals 115 for data and clock signals through interconnections (signal wires) via the diffused regions 116.

The problem of the prior art will be explained. When the elements such as MOSFET's and CMOS inverters in a given macrocell 112 carry out a switching operation in synchronization with a clock signal, a through current or "a short-circuit current" flows from the terminal VDD to the terminal GND. The through current is an active switching current often produced by CMOS inverters during a transition period. The DC-like short-circuit current flows along an arrow labeled (1) in FIG. 1B. Since the chip 111 includes several thousands to several tens of thousands of transistors, the through current (short-circuit current) may reach several hundred milliamperes. Such a large current is hardly absorbed by the diffused region 116 under the I/O terminal 115 due to high impedance between each macrocell 112 and the diffused region 116 and causes fluctuation of the potential at the I/O terminal 115. In addition, the short-circuit current and the resistance and capacitance of the substrate fluctuate the potential of the substrate, which must be maintained at a given level, to again cause the potential fluctuation at the I/O terminal 115.

In addition to the short-circuit current, an operating current flows from the source to drain of any transistor that is active. Part of the operating current flows into the substrate as indicated with an arrow labeled (2) in FIG. 1B to become "a substrate current". Like the short-circuit current, this substrate current fluctuates the potential of the substrate, to cause potential fluctuation at the I/O terminal 115.

The fluctuation of the current and the potential at the I/O terminal 115 becomes noise, and the noise changes the threshold of each circuit on the chip 111, affects peripheral circuits, and causes malfunctions. The noise is a serious problem because recent semiconductor integrated circuits employ a reduced operating voltage such as 2.5V, 1.8V, 1.5V, 1.0V, . . . and a fine structure. The reduction of I/O voltage is also required.

As explained above, the prior art causes a short-circuit current to flow from the voltage source terminal VDD to the grounding terminal GND when the transistors (or CMOS's) of a given macrocell 112 carry out a switching operation in response to a clock signal. At the same time, part of an operating current of each transistor flows into the substrate. The short-circuit and substrate currents cause noise at the I/O terminal 115. In addition, the short-circuit and substrate currents and the resistance and capacitance of the substrate fluctuate the potential of the substrate, to cause noise at the I/O terminal 115.

SUMMARY OF THE INVENTION

An object of the present invention is to provide a semiconductor integrated circuit capable of properly absorbing short-circuit and substrate currents caused by active elements such as transistors contained in each macrocell of the integrated circuit, thereby suppressing noise and securing the stable operation of an I/O terminal and the integrated circuit.

Another object of the present invention is to provide a semiconductor integrated circuit capable of blocking a current or a potential change that may cause noise at an I/O terminal, thereby securing the stable operation of the integrated circuit and peripheral circuits.

Still another object of the present invention is to provide a semiconductor integrated circuit capable of operating with a low supply voltage, consuming little power, and being reliable.

In order to accomplish the objects, a first aspect of the present invention provides a semiconductor integrated circuit formed on a semiconductor substrate, i.e., a semiconductor chip. The semiconductor substrate may include epitaxial substrate, Silicon-On-Insulator (SOI) substrate and Silicon-On-Sapphire (SOS) substrate. The circuit comprises macrocells and a means for suppressing noise formed on the semiconductor substrate. The suppressing means including a diffused region of high impurity concentration is formed around at least one of the macrocells. Each macrocell consists of semiconductor elements such as transistors and CMOS circuit. The diffused region is electrically coupled to a bias voltage supplying unit. The bias voltage supplying unit has a terminal for supplying a bias voltage to the diffused region. This terminal is independent of a terminal for supplying an operating voltage to the elements in each macrocell. The bias voltage supplying unit may employ a common terminal, which supplies an operating voltage both to the elements of each macrocell and to the diffused region through a branched line or spacially independent line, respectively. The impedance of the branched line between each macrocell and the common terminal is higher than that of a line between the diffused region and the common terminal. The impedance of the spacially independent line between each macrocell and the common terminal is substantially same as that of the line between the diffused region and the common terminal VDD.

The short-circuit current and substrate current which become noise are absorbed by the diffused region and by the terminal for supplying the bias voltage or operating voltage. The diffused region may completely or partly surround the macrocell. For example, the diffused region may be divided into two to four sections, which are connected to one another through surface metal wiring or surface polysilicon wiring.

A second aspect of the present invention provides a semiconductor integrated circuit including macrocells each containing many semiconductor elements. A power source unit and a grounding unit supply an operating voltage to the elements of each macrocell. Formed around at least one macrocell is a first diffused region. The diffused region is formed at the surface of the substrate away from the macrocell. The impurity concentration of the diffused region is higher than that of the substrate. A first means such as a first bias unit supplies a first bias voltage to the diffused region. The power source unit may consist of a first power line and a first terminal for supplying an operating voltage. The grounding unit may consist of a line and a grounding terminal. The first bias unit (serving as the first supplying means) may consist of a second power line and a second terminal for supplying the first bias voltage. The bias voltage from the second terminal may be equal or close to the voltage from the first terminal. The first and second terminals must be independent of each other.

The aspect may be modified to the structure that the first bias unit consists of a third power line and a third terminal for supplying a first bias voltage. The voltage from the third terminal is equal or close to the voltage from the grounding terminal. A second diffused region is formed around the first diffused region. The diffused region is connected to the second terminal for supplying the first bias voltage, and the second diffused region is connected to the third terminal serving as the second supplying means for supplying a second bias voltage. Any one of the first and second diffused regions may completely or partly surround the corresponding macrocell.

The elements such as transistors formed in each macrocell produce the short-circuit current and/or substrate current, which are absorbed by the diffused regions connected to the second and third terminals through the second and third power lines that are independent of the first power and grounding lines connected to the elements of each macrocell. The diffused regions thus prevent noise at the I/O terminal for data and clock signals. The diffused regions also prevent a fluctuation in the potential of the substrate, thereby suppressing or preventing noise at the I/O terminal 15.

Consequently, the diffused regions secure the stable and sound operation of not only the chip of its own but also peripheral chips that collectively form an electronic circuit together with the chip in question.

A third aspect of the present invention provides a semiconductor integrated circuit formed on a semiconductor substrate on which macrocells are formed. Each macrocell includes semiconductor elements, which are connected to a supply terminal for supplying an operating voltage as well as to a grounding terminal. At least one of the macrocells is surrounded by a diffused region (a first diffused region). The first diffused region is formed at the surface of the substrate away from the macrocell. The impurity concentration of the first diffused region is higher than that of the substrate. The first diffused region is connected to the supply terminal through a first power line. The semiconductor elements of each macrocell are connected to the supply terminal through a second power line having a higher impedance or higher resistance than the first power line, as well as to the grounding terminal through a third power line.

The second power line is branched from the first power line. To increase the impedance of the second power line higher than that of the first power line, it may be made of a thin film of polysilicon, Ti, Mo, W, Co, $TiSi_2$, $MoSi_2$, $WSi_2$ or $CoSi_2$. In particular, a polysilicon thin film is preferable because the impurity concentration and thickness thereof is adjustable to provide a desired high impedance.

The third aspect may be modified to the structure that a high-impedance second power line is connected to the grounding terminal. The first diffused region (the first diffused region) is surrounded by a second diffused region.

The resistivity of the diffused region(s) is lower than that of the substrate, to absorb the short-circuit current and/or substrate current produced by the elements such as CMOS circuitries in the macrocell around which the diffused region (s) is formed. Since the elements in the macrocell are connected to the supply terminal through the high-impedance power line, the elements are free from fluctuation in the potential of the diffused region(s).

The first or second diffused region absorbs the short-circuit currents and/or substrate current, thereby causing no noise at the I/O terminal for data and clock signals. At the same time, the diffused region suppresses fluctuation in the potential of the substrate due to the short-circuit current and/or substrate current, to stabilize the potential of the substrate and prevent noise at the I/O terminal. In this way, the first or second diffused region secures the stable operations of the elements of the macrocell around which the diffused region is formed. This results in securing the stabilized operations of the elements of other macrocells formed on the same chip. By suppressing or blocking noise to appear at the I/O terminal, the first or second diffused region secures the correct operation of not only the chip of its own but also peripheral chips that collectively form an electronic circuit together with the chip in question.

A fourth aspect of the present invention provides a semiconductor integrated circuit formed on a semiconductor substrate on which macrocells are formed. Each macrocell includes semiconductor elements such as CMOS inverters. The elements of each macrocell are connected to a supply terminal for supplying an operating voltage and to a grounding terminal. At least one of the macrocells is surrounded by a first diffused region. The first diffused region is formed at the surface of the substrate away from the macrocell. The impurity concentration of the diffused region is higher than that of the substrate. The elements of each macrocell are connected to the supply terminal through a first power line and to the grounding terminal through a second power line. The first diffused region is connected to one of the supply and grounding terminals through a third power line. The first power line and the third power line are independent of each other, and the second power line and the third power line are independent of each other.

The fourth aspect may be modified to the structure that the first diffused region is surrounded by a second diffused region.

The resistivity of the first and second diffused regions is lower than that of the substrate, to absorb the short-circuit current and/or substrate current produced by the elements such as transistors in the macrocell that is surrounded by the first and second diffused regions. A fluctuation in the potential of the first and second diffused regions is transmitted through the third and fourth power lines to the supply and fourth terminals, and then to the first and second power lines. Before reaching the elements in the macrocell, the fluctuation is absorbed by the power lines and terminals.

Consequently, the through and substrate currents never cause noise at the I/O terminal for data and clock signals, nor a fluctuation in the potential of the substrate. Namely, the potential of the substrate is stabilized to cause no noise at the I/O terminal. The first and second diffused regions secure the sound operations of not only the elements in the macrocell surrounded by the diffused regions but also the elements of other macrocells that are present on the same chip. The diffused regions suppress or prevent noise to appear at the I/O terminal, to secure the stable operation of not only the chip of its own but also peripheral chips that collectively form an electronic circuit together with the chip in question.

Other and further objects and features of the present invention will become obvious upon an understanding of the illustrative embodiments about to be described in connection with the accompanying drawings or will be indicated in the appended claims, and various advantages not referred to herein will occur to one skilled in the art upon employing of the invention in practice.

DETAILED DESCRIPTION OF THE EMBODIMENTS

Various embodiments of the present invention will be described with reference to the accompanying drawings. It is to be noted that the same or similar reference numerals are used for the same or similar parts and elements throughout the drawings, and the description of the same or similar parts and elements will be omitted or simplified.

(First embodiment)

Figure 2A:
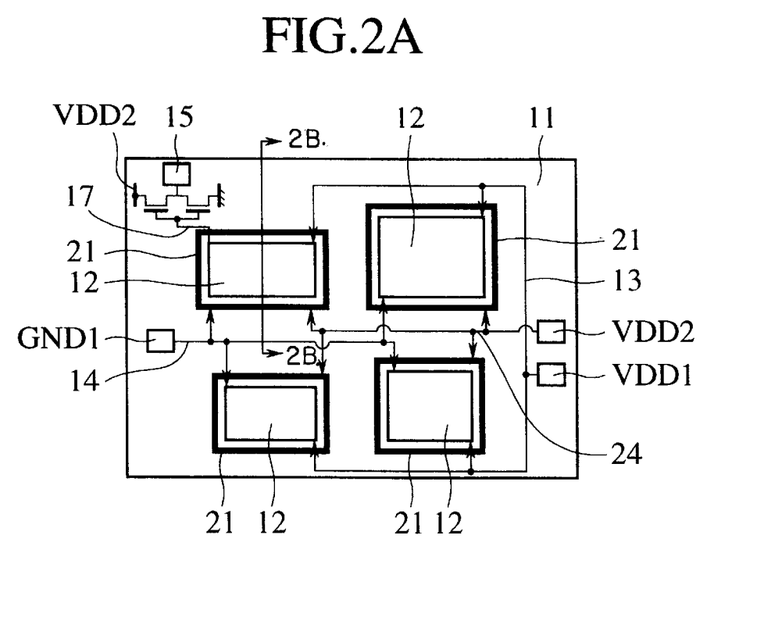
FIG. 2A is a top view showing a semiconductor integrated circuit according to a first embodiment of the present invention.
Figure 2B:
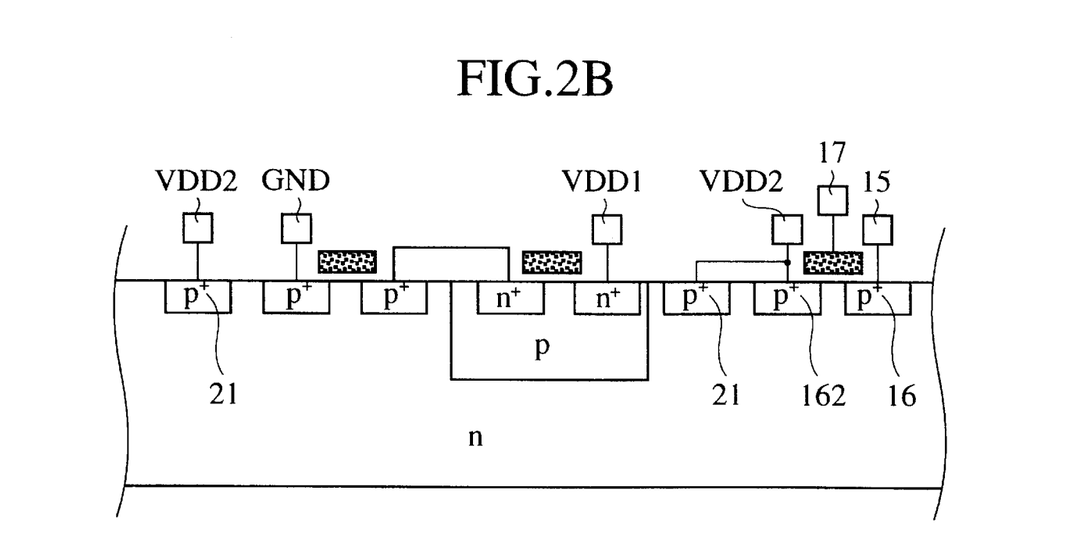
FIG. 2B is a cross-sectional view taken along a line A—A of FIG. 2A.

FIG. 2A is a top view showing a semiconductor circuit according to the first embodiment of the present invention, and FIG. 2B is a cross-sectional view taken along a line A—A of FIG. 2A. For the sake of simplicity of explanation, elements such as transistors of the circuit are omitted and only essential wiring is shown in the drawings. The circuit is formed on a semiconductor substrate 11, i.e., a semiconductor chip on which macrocells 12 are formed away from one another. The elements of each macrocell 12 are connected to a terminal VDD1 for supplying an operating voltage through a power line 13 and to a grounding terminal GND1 through a power line 14. The power lines 13 and 14 are for example surface interconnect lines made of a conductive film of Al, Al—Si, Al—Cu—Si, Cu, or doped polysilicon, or inside lines made of a diffused or buried region of conductive impurities such as B, P, As. An I/O terminal 15 for data and clock signals is formed on the substrate 11. The I/O terminal 15 is connected to a diffused region 16 of conductive impurities of high concentration formed in the substrate 11. The I/O terminal 15 is capacitively coupled with the substrate 11 through the diffused region 16.

Although the first embodiment resembles the prior art in that it has macrocell on a semiconductor chip, the first embodiment includes a diffused region 21 around each macrocell 12 and a bias voltage is supplied to the diffused regions 21. A system for supplying the bias voltage is different from a system for supplying an operating voltage to the elements in each macrocell 12.

The diffused regions 21 are connected, through a power line 24, to a terminal VDD2 for supplying the bias voltage. The terminal VDD2 is independent of the terminals VDD1 and GND1. A diffused region 162 of high impurity concentration is connected to the terminal VDD2. The diffused region 162 serves as a source region of a MOSFET, and the diffused region 16 serves as a drain region. A gate electrode 17 of the MOSFET is formed on a gate insulation film that is formed on a channel region between the source region 162 and drain region 16. The gate electrode is connected to a signal line 17 or serves itself as a signal line 17. Accordingly, the diffused region 16 electrically connected to the I/O terminal 15 is coupled to the signal line 17 through the Miller capacitance of the MOSFET. The signal line 17 may be a surface interconnect wire or a diffused region formed in the substrate 11.

The bias voltage supplied to the diffused regions 21 is not particularly limited. The bias voltage supplying system is independent of the operating voltage supplying system, so that fluctuation in the bias voltage never affects the operation of the elements of the macrocells 12. The bias voltage may be equal to the voltage of the terminal VDD1 or GND1. In this case, a separate bias voltage source is not needed. It is important, however, that the power line 24 connected to the diffused regions 21 must be independent of the power lines 13 and 14 connected to the elements of the macrocells 12.

In the following explanation, a voltage at the terminal VDD2 is equal to or close to a voltage at the terminal VDD1, and a voltage at a terminal GND2 (FIG. 3B) is equal to or close to a voltage at the terminal GND1. It is most preferable that VDD1=VDD2 and GND1=GND2. However, a deviation of about plus of minus 0.5 V is allowed.

The conductivity type of the diffused regions 21 is not particularly limited. If the conductivity type of the substrate 11 is n-type and if the diffused region 21 is connected to the terminal VDD2, the diffused region 21 will be p-type. If the substrate is n-type and if the diffused region 21 is connected to the terminal GND2, the diffused region 21 will be n-type. The diffused region 21 will have an opposite conductivity type if the substrate is p-type. If each macrocell 12 is formed in a well whose conductivity type is opposite to that of the substrate 11, the conductivity type of the diffused region 21 will be the same as that of the well if it is connected to the terminal GND2, and will be opposite to that of the well if it is connected to the terminal VDD2.

The impurity concentration of the diffused region 21 must be higher than that of the substrate 11 or the well where the diffused region 21 is formed, so that the resistivity of the diffused region 21 is lower than that of the substrate 11 or the well. Generally, the impurity concentration of the diffused region 21 is 10 to 100 times as large as that of the substrate 11 or well, for example, $1 \times 10^{19} \sim 1 \times 10^{21}$ cm$^{-3}$. In practice, the diffused region 21 and the source and drain regions of MOSFETs in the macrocell 12 may simultaneously be formed by ion implantation so that they have the same impurity concentration.

The embodiment of FIG. 2A surrounds each of the macrocells 12 with the diffused region 21. This does not limit the present invention. The diffused region 21 may be formed around at least one of the macrocells 12. In this case, it is most effective that the diffused region 21 is formed around the most noisy macrocell. Also, the diffused region 21 can partially surround the macrocell 12.

According to the embodiment of FIG. 2A, the macrocell 12 is surrounded by the diffused region 21 that is connected to a terminal for supplying a bias voltage. Instead, the macrocell 12 may be surrounded by a first diffused region connected to a terminal (VDD2 or GND2) for supplying a first bias voltage, and a second diffused region may be formed around the first diffused region and is connected to another terminal (GND2 or VDD2) for supplying a second bias voltage. It is preferable that the first and second diffused regions have opposite conductivity types.

Figure 3A:
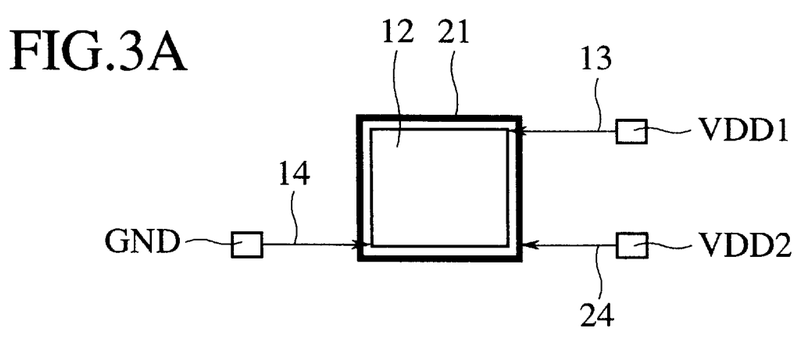
FIG. 3A is an enlarged view showing a part of FIG. 2A.
Figure 3B:
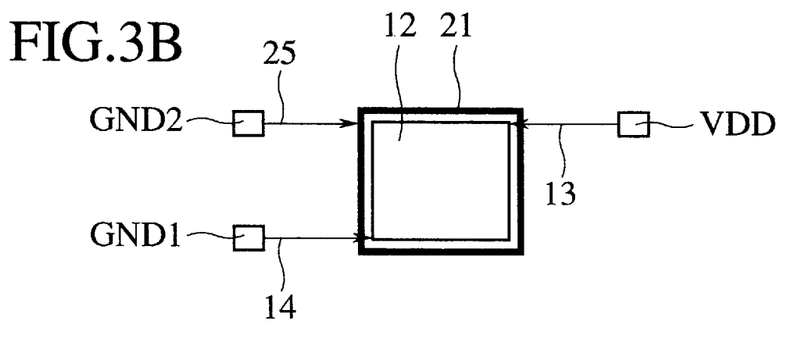
FIG. 3B shows a modification of the first embodiment.
Figure 3C:
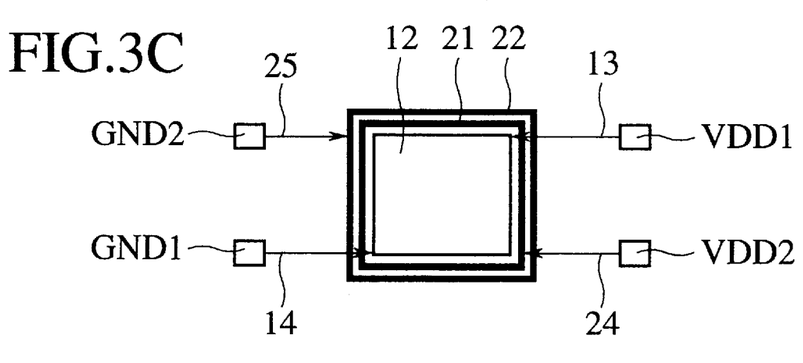
FIG. 3C shows another modification of the first embodiment.

FIGS. 3A to 3C show different forms of the first embodiment. For simplicity, each of the figures shows only one macrocell 12 surrounded by a diffused region(s).

FIG. 3A shows a part of FIG. 2A and is a basic form of the first embodiment. The elements of the macrocell 12 are connected to the voltage source terminal VDD1 through the power line 13 and to the grounding terminal GND through the power line 14. The diffused region 21 formed around the macrocell 12 is connected to the bias voltage terminal VDD2 through the power line 24. The conductivity type of the diffused region 21 is opposite to that of the substrate 11.

FIG. 3B shows a first modification of the first embodiment. The elements of the macrocell 12 are connected to the voltage source terminal VDD1 through the power line 13 and to the grounding terminal GND1 through the power line 14. The diffused region 21 formed around the macrocell 12 is connected to a terminal GND2 for supplying a bias voltage through a power line 25. The voltage at terminal GND2 is equal to or close to that of terminal GND1. The conductivity type of the diffused region 21 is the same as that of the substrate 11.

FIG. 3C shows a second modification of the first embodiment. This is a combination of FIGS. 3A and 3B. The elements of the macrocell 12 are connected to the voltage source terminal VDD1 through the power line 13 and to the grounding terminal GND1 through the power line 14. The first diffused region 21 formed around the macrocell 12 is connected to the terminal VDD2 for supplying a first bias voltage through the power line 24. A second diffused region 22 formed around the first diffused region 21 is connected to the terminal GND2 for supplying a second bias voltage through the power line 25. The conductivity type of the first diffused region 21 is opposite to that of the substrate 11, and that of the second diffused region 22 is the same as that of the substrate 11. Either or both of the region 21 and 22 may completely or partially surround the macrocell 12. Or, all of the bias voltages and conductivity types of the diffused regions 21 and 22 may be opposite to those mentioned above, respectively. The terminals VDD2 and GND2 that supply bias voltages to the diffused regions 21 and 22 are independent of the terminals VDD1 and GND1 connected to the elements of the macrocell 12. Accordingly, the short-circuit current and/or through current produced by the elements are completely absorbed by the bias voltages supplied from the terminals VDD2 and GND2.

(Second embodiment)

Figure 4:
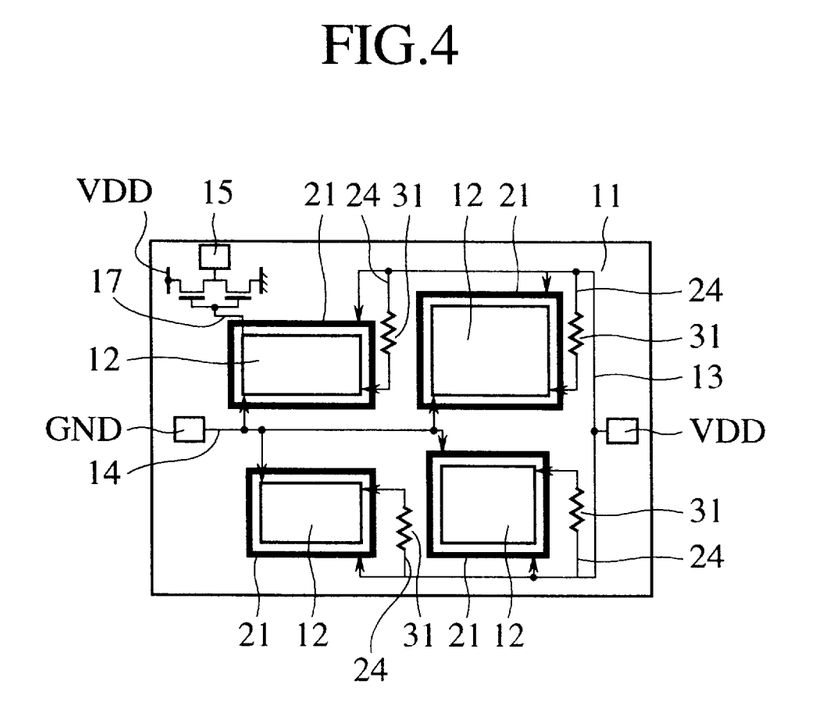
FIG. 4 is a top view showing a semiconductor integrated circuit according to a second embodiment of the present invention.

FIG. 4 is a top view showing a semiconductor integrated circuit according to the second embodiment of the present invention. The second embodiment has a different bias voltage supplying means from that of the first embodiment.

The circuit is formed on a semiconductor substrate 11, i.e., a semiconductor chip on which macrocells 12 are formed. Each macrocell 12 is surrounded by a diffused region 21 that is connected to a terminal VDD (GND) through a power line 13 (14). Semiconductor elements in each macrocell 12 are also connected to the terminal VDD (GND) through a high-impedance power line 24 (25) that is branched from the power line 13 (14). The impedance of the power line 24 (25) is, for example, 10 to 100 ohms, which is one to four digits higher than the impedance of the power line 13 (14).

The branch 24 has a resistor 31 to increase the impedance thereof. The resistor 31 may be a high-resistivity polysilicon film of 100 to 500 nm thick or an extremely thin film of W, Ti, or Mo of 10 to 100 nm thick formed on an insulation film such as silicon oxide ($SiO_2$), phosphosilicate glass (PSG), borophosphosilicate glass (BPSG) covering the surface of the substrate 11. The resistor 31 must not be a diffused region or buried region in the substrate 11, so that the resistor 31 may not cause noise or may not be affected by a fluctuation in the potential of the substrate 11.

The impurity concentration of the diffused region 21 is higher than that of the substrate 11, so that the resistivity of the diffused region 21 is lower than that of the substrate 11. Generally, the impurity concentration of the diffused region 21 is 10 to 100 times higher than that of the substrate 11 such as $10^{19} \sim 10^{21}$ cm$^{-3}$. The embodiment of FIG. 4 forms the diffused region 21 around each macrocell 12. This does not limit the present invention. The diffused region may be formed around at least one of the macrocells 12. It is most effective that the diffused region 21 is formed around a macrocell 12 that causes noise.

Figure 5A:
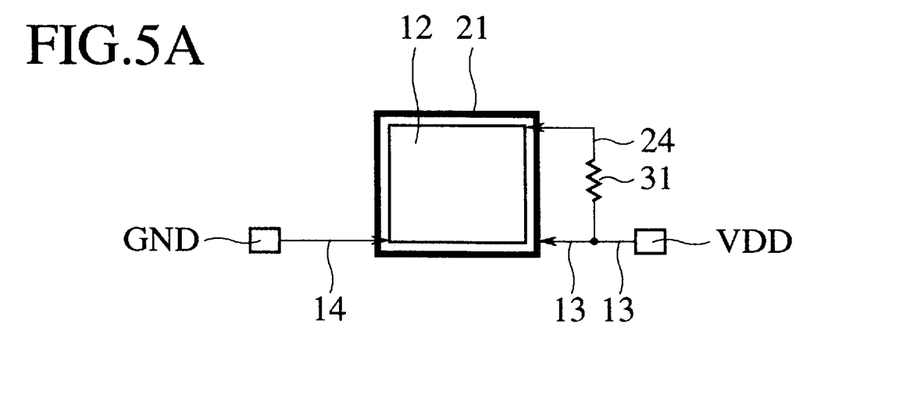
FIG. 5A is an enlarged view showing a part of FIG. 4.
Figure 5B:
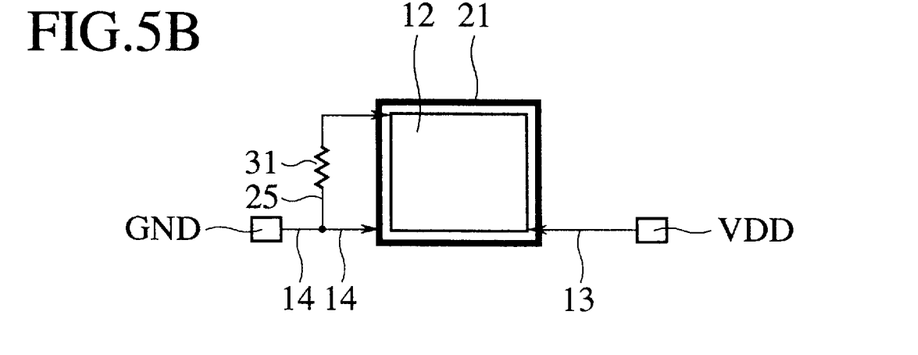
FIG. 5B shows a modification of the second embodiment.
Figure 5C:
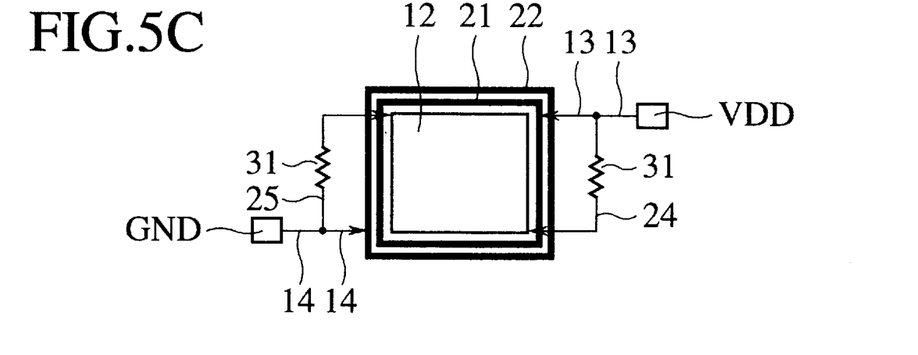
FIG. 5C shows another modification of the second embodiment.

FIGS. 5A to 5C show different forms of the second embodiment. For convenience' sake, each of the figures shows only one macrocell 12 surrounded by a diffused region(s).

FIG. 5A shows a part of FIG. 4 and is a basic form of the second embodiment. The elements of the macrocell 12 are connected to the high-impedance power line 24 that is branched from the power line 13 extending from the voltage source terminal VDD. The branch 24 has the resistor 31 to realize high impedance. At the same time, the elements of the macrocell 12 are connected to the grounding terminal GND through the power line 14. The diffused region 21 formed around the macrocell 12 is connected to the terminal VDD through the power line 13. The conductivity type of the diffused region 21 is opposite to that of the substrate 11.

FIG. 5B shows a first modification of the second embodiment. The elements of the macrocell 12 are connected to the voltage source terminal VDD through the power line 13 and to the grounding terminal GND through a high-impedance power line 25 branched from the power line 14. The branch power line 25 has a resistor 31 to realize high impedance. The diffused region 21 formed around the macrocell 12 is connected to the terminal GND through the power line 14. The conductivity type of the diffused region 21 is the same as that of the substrate 11.

FIG. 5C shows a second modification of the second embodiment. This is a combination of FIGS. 5A and 5B. The elements of the macrocell 12 are connected to the voltage source terminal VDD through the high-impedance power line 24 branched from the power line 13. The elements of the macrocell 12 are also connected to the grounding terminal GND through the high-impedance power line 25 branched from the power line 14. The first diffused region 21 formed around the macrocell 12 is connected to the terminal VDD through the power line 13. The second diffused region 22 formed around the first diffused region 21 is connected to the terminal GND through the power line 14. The conductivity type of the first diffused region 21 is opposite to that of the substrate 11, and that of the second diffused region 22 is the same as that of the substrate 11. The bias voltages and conductivity types of the diffused regions 21 and 22 may completely be opposite to those mentioned above.

The second embodiment connects the diffused regions 21 and 22 and the elements of the macrocell 12 to the terminals VDD and GND. The resistor 31 may be connected in series with each of the branch power lines 24 and 25 so that the impedance of the branches 24 and 25 is higher than that of the power lines 13 and 14. The short-circuit current and/or through current produced by the elements of the macrocells 12 flow into the power lines 13 and 14 having lower impedance and are absorbed by the terminals VDD and GND which also have lower impedance. The number of terminals of the second embodiment is smaller than that of the first embodiment.

(Third embodiment)

Figure 6:
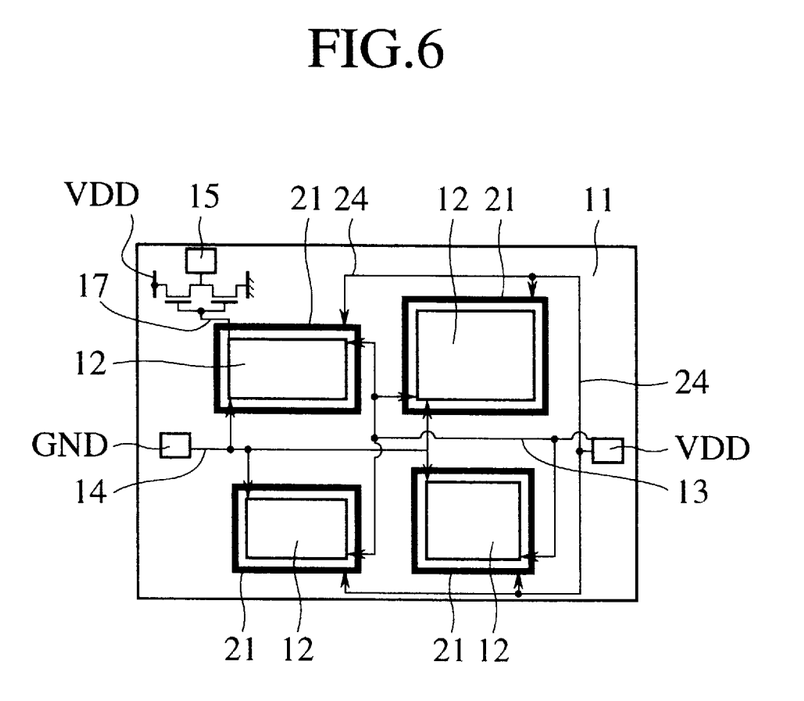
FIG. 6 is a top view showing a semiconductor integrated circuit according to a third embodiment of the present invention.

FIG. 6 is a top view showing a semiconductor integrated circuit according to the third embodiment of the present invention. The third embodiment has a different bias voltage supplying means from that of the first and second embodiments.

The circuit comprises a plurality of macrocells 12 formed on a semiconductor substrate 11, i.e., a semiconductor chip. Each macrocell 12 is surrounded by a diffused region 21, which is connected to a terminal VDD for supplying an operating voltage through a power line 24. Semiconductor elements in each macrocell 12 are connected to the terminal VDD through a power line 13, that is spacially independent of the power line 24. The elements are also connected to a grounding terminal GND through a power line 14. The impurity concentration of the diffused region 21 is higher than that of the substrate 11 so that the resistivity of the diffused region 21 is lower than that of the substrate 11. Generally, the impurity concentration of the diffused region 21 is 10 to 100 times as large as that of the substrate 11. The embodiment of FIG. 6 forms the diffused region 21 around each macrocell 12. This does not limit the present invention. The diffused region 21 may be formed around at least one of the macrocells 12 that causes noise.

Figure 7A:
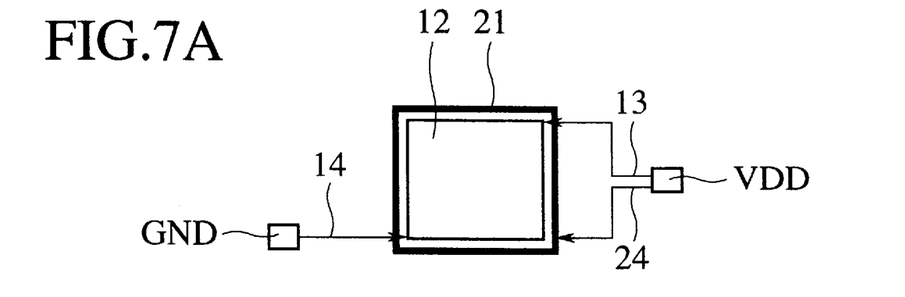
FIG. 7A is an enlarged view showing a part of FIG. 6.
Figure 7B:
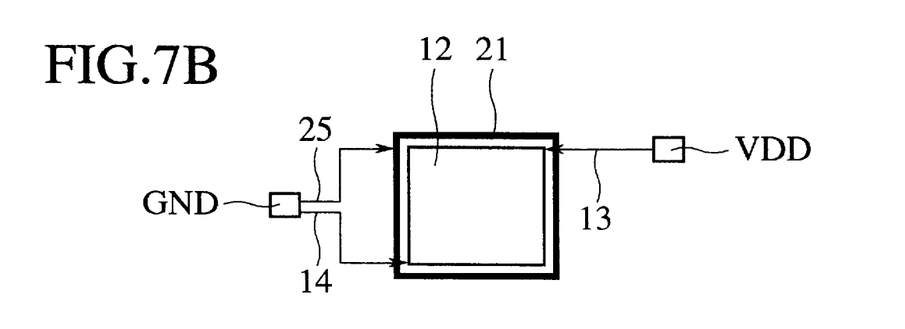
FIG. 7B shows a modification of the third embodiment.
Figure 7C:
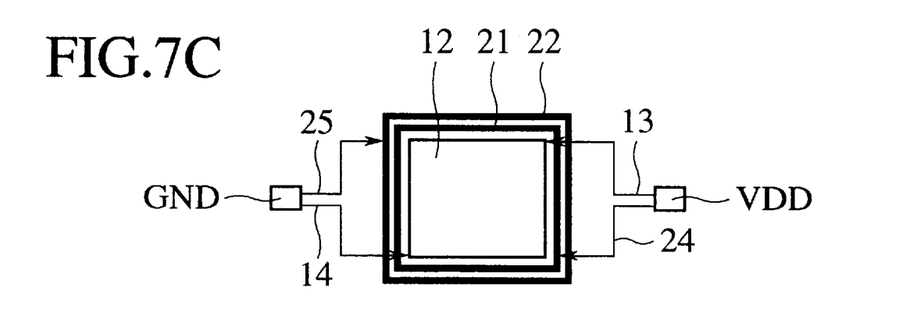
FIG. 7C shows another modification of the third embodiment.

FIGS. 7A to 7C show different forms of the third embodiment. Each of the figures shows only one macrocell 12 surrounded by a diffused region(s).

FIG. 7A shows a part of FIG. 6 for convenience of explanation and is a basic form of the third embodiment. The elements of the macrocell 12 are connected to the voltage source terminal VDD through the first power line 13 and to the grounding terminal GND through the second power line 14. The macrocell 12 is surrounded by the diffused region 21 that is connected to the terminal VDD through the third power line 24. The conductivity type of the diffused region 21 is opposite to that of the substrate 11.

FIG. 7B shows a first modification of the third embodiment. The elements of the macrocell 12 are connected to the voltage source terminal VDD through the first power line 13 and to the grounding terminal GND through the second power line 14. The macrocell 12 is surrounded by the diffused region 21 that is connected to the terminal GND through a third power line 25, which is spacially independent of the power line 14. The conductivity type of the diffused region 21 is the same as that of the substrate 11.

FIG. 7C shows a second modification of the third embodiment. This is a combination of FIGS. 7A and 7C. The elements of the macrocell 12 are connected to the voltage source terminal VDD through the power line 13 and to the grounding terminal GND through the power line 14. The macrocell 12 is surrounded by the first diffused region 21 that is connected to the terminal VDD through the power line 24. The first diffused region 21 is surrounded by the second diffused region 22 that is connected to the terminal GND through the fourth power line 25. The conductivity type of the first diffused region 21 is opposite to that of the substrate 11, and that of the second diffused region is same as that of the substrate 11. The bias voltages and conductivity types of the first and second diffused regions 21 and 22 may be totally opposite to those mentioned above.

Although the diffused regions 21 and 22 and the elements of the macrocell 12 are connected to the same terminals, the power lines 24 and 25 for connecting the diffused regions 21 and 22 to the terminals VDD and GND are spacially independent of the power lines 13 and 14 for connecting the elements of the macrocell 12 to the terminals VDD and GND. The resistivity of the diffused regions 21 and 22 is lower than that of the substrate 11. Accordingly, the short-circuit current and/or through current produced by the elements of the macrocell 12 are absorbed by the diffused regions 21 and 22, and these currents are passed through the power lines 24 and 25 to the low impedance terminals VDD and GND. Even if these currents are transferred to the power lines 13 and 14, the currents are absorbed by them before they reach the elements of the macrocell 12. In general, the short-circuit and through currents will not be transferred back to the power lines 13 and 14, because the impedance of the power line 13 or 14 is relatively higher than the impedance of the power supply source VDD or GND. The third embodiment requires no increase in the number of terminals nor resistors in the power lines. Only the additional power lines 24 and 25 are sufficient to achieve the effect of the present invention.

Various modifications will become possible for those skilled in the art after receiving the teachings of the present disclosure without departing from the scope thereof. For example, the diffused regions around the macrocell 12 may completely or partly surround the macrocell 12. The diffused regions may be divided into two to four sections, which are connected to one another through surface wiring. Or the diffused region may be a semi-closed ring around the macrocell. Even if the diffused region partly surrounds the macrocell 12, it absorbs the short-circuit and substrate currents produced by the semiconductor elements in the macrocell 12. Even if the divided sections of the diffused region are spaced from one another by a diffusion length of $L_p$ ($=\sqrt{D_p \tau_p}$) or $L_n$ ($=\sqrt{D_n \tau_n}$), they will substantially shield the macrocell 12.

What is claimed is:

1. A semiconductor integrated circuit comprising:

a semiconductor substrate;

at least one macrocell, each macrocell including CMOS elements formed on the substrate; and means for absorbing short-circuit current produced by the CMOS elements, the means formed on the substrate and including a high-impurity-concentration diffused region formed at the surface of the substrate and at least around one of the macrocells.

2. The circuit of claim 1, wherein said suppressing means further including a bias voltage supplying unit, electrically coupled to the diffused region to supply a bias voltage to the diffused region.

3. The circuit of claim 2, wherein the bias voltage supplying unit has a bias voltage supplying terminal that is independent of a terminal for supplying an operating voltage to the semiconductor elements.

4. The circuit of claim 2, wherein the bias voltage supplying unit commonly employs a terminal for supplying an operating voltage to the semiconductor elements, wherein an impedance of a line connecting the semiconductor elements to the terminal being substantially same or higher than that of a line for connecting the diffused region to the terminal.

5. A semiconductor integrated circuit comprising:

a semiconductor substrate;

macrocells each including CMOS elements formed on the substrate;

voltage source means and grounding means, for supplying an operating voltage to the CMOS elements;

a first diffused region formed at the surface of the substrate around and separated from at least one of the macrocells for absorbing short-circuit current produced by the CMOS elements, the impurity concentration of the first diffused region being higher than that of the substrate; and a first means for supplying a first bias voltage to the first diffused region.

6. The circuit of claim 5, further comprising:

a second diffused region formed at the surface of the substrate around and separated from the first diffused region, the impurity concentration of the first diffused region being higher than that of the substrate; and a second means for supplying a second bias voltage to the second diffused region, wherein a conductivity type of one of the first and the second diffused regions is opposite to that of the substrate.

7. The circuit of claim 6, wherein the first and second diffused regions have different conductivity types.

8. A semiconductor integrated circuit comprising:

a semiconductor substrate;

macrocells each including semiconductor elements formed on the substrate;

a voltage source terminal and a grounding terminal, for supplying an operating voltage to the semiconductor elements;

a first diffused region formed at the surface of the substrate around and separated from at least one of the macrocells, an impurity concentration of the first diffused region being higher than that of the substrate;

a first power line connected to the first diffused region and to the voltage source terminal;

a second power line connected to the semiconductor elements and the voltage source terminal, the impedance of the second power line being higher than that of the first power line; and a third power line connected to the semiconductor elements and the grounding terminal.

9. The circuit of claim 8, wherein the second power line is connected to the first power line.

10. The circuit of claim 8, wherein the second power line is at least partly made of a polysilicon film.

11. The circuit of claim 8, wherein the first and second power lines are independent, and said voltage terminal comprises independent first and second voltage terminals connected to said first and second power respectively.

12. A semiconductor integrated circuit comprising:

a semiconductor substrate;

macrocells each including semiconductor elements formed on the substrate;

a voltage source terminal and a grounding terminal, for supplying an operating voltage to the semiconductor elements;

a first diffused region formed at the surface of the substrate around and separated from at least one of the macrocells, the impurity concentration of the first diffused region being higher than that of the substrate;

a first power line connected to the first diffused region and the grounding terminal;

a second power line connected to the semiconductor elements and the grounding terminal, the impedance of the second power line being higher than that of the first power line; and a third power line connected to the semiconductor elements and the voltage source terminal.

13. The circuit of claim 12, wherein the second power line is connected to the first power line.

14. The circuit of claim 12, wherein the second power line is at least partly made of a polysilicon film.

15. The circuit of claim 12, wherein the first and second power lines are independent, and said voltage terminal comprises independent first and second voltage terminals connected to said first and second power respectively.

16. A semiconductor integrated circuit comprising:

a semiconductor substrate;

macrocells each including semiconductor elements formed on the substrate;

a voltage source terminal and a grounding terminal, for supplying an operating voltage to the semiconductor elements;

a first diffused region formed at the surface of the substrate around and separated from at least one of the macrocells, an impurity concentration of the first diffused region being higher than that of the substrate;

a second diffused region formed at the surface of the substrate around and separated from the first diffused region, an impurity concentration of the second diffused region being higher than that of the substrate;

a first power line connected to the first diffused region and the voltage source terminal;

a second power line connected to the semiconductor elements and the grounding terminal, the impedance of the second power line being higher than that of the first power line;

a third power line connected to the second diffused region and the grounding terminal; and a fourth power line connected to the semiconductor elements and the grounding terminal, an impedance of the fourth power line being higher than that of the third power line.

17. The circuit of claim 16, wherein the second power line is connected to the first power line, and the fourth power line is connected to the third power line.

18. The circuit of claim 16, wherein the second and fourth power lines are at least partly made of a polysilicon film.

19. The circuit of claim 16, wherein the first and second diffused regions have different conductivity types.

20. A semiconductor integrated circuit comprising:

a semiconductor substrate;

macrocells each including CMOS elements formed on the substrate;

voltage source means and grounding means, for supplying an operating voltage to the CMOS elements;

a first diffused region formed at the surface of the substrate around and separated from at least one of the macrocells for absorbing short-circuit current produced by the CMOS elements, the impurity concentration of the first diffused region being higher than that of the substrate; and a first power line connected to the CMOS elements and the voltage source terminal;

a second power line connected to the CMOS elements and the grounding terminal; and a third power line connected to the diffused region and one of the voltage source and grounding terminals.

21. The circuit of claim 20, further comprising:

second diffused region formed at the surface of the substrate around and separated from the first diffused region, the impurity concentration of the first diffused region being higher than that of the substrate; and a fourth power line connected to the second diffused region and one of the grounding and voltage source terminals, which is not connected to said third power line, wherein a conductivity type of one of the first and the second diffused regions is opposite to that of the substrate.

22. The circuit of claim 21, wherein the first and second diffused regions have different conductivity types.

* * * * *